US009086460B2

(12) United States Patent
Rice et al.

(10) Patent No.: US 9,086,460 B2
(45) Date of Patent: Jul. 21, 2015

(54) APPARATUS AND METHOD FOR MONITORING THE STATE OF CHARGE OF A BATTERY CELL

(75) Inventors: Maria F. Rice, Evanston, IL (US); Christopher Jones, Carpentersville, IL (US)

(73) Assignee: Methode Electronics, Inc., Chicago, IL (US)

( * ) Notice: Subject to any disclaimer, the term of this patent is extended or adjusted under 35 U.S.C. 154(b) by 989 days.

(21) Appl. No.: 13/148,230

(22) PCT Filed: Feb. 4, 2010

(86) PCT No.: PCT/US2010/023181
§ 371 (c)(1),
(2), (4) Date: Apr. 19, 2012

(87) PCT Pub. No.: WO2010/091170
PCT Pub. Date: Aug. 12, 2010

(65) Prior Publication Data
US 2013/0154652 A1 Jun. 20, 2013

Related U.S. Application Data

(60) Provisional application No. 61/150,091, filed on Feb. 5, 2009.

(51) Int. Cl.
*G01N 27/416* (2006.01)
*G01R 31/36* (2006.01)
(Continued)

(52) U.S. Cl.
CPC .......... *G01R 31/3606* (2013.01); *H01M 10/425* (2013.01); *H01M 10/48* (2013.01);
(Continued)

(58) Field of Classification Search
CPC .......... G01R 31/3648; G01R 31/3627; G01R 31/3662; G01R 31/3631; Y02E 60/12; H02J 7/0016; H02J 7/0026; H02J 7/0021; Y02T 10/7055
USPC .......................................... 324/426
See application file for complete search history.

(56) References Cited

U.S. PATENT DOCUMENTS 5,093,624 A    3/1992  Stevenson
5,250,903 A   10/1993  Limuti et al.
(Continued)

FOREIGN PATENT DOCUMENTS

EP    1009049 A2   6/2000
FR    2737923 A1   2/1997
(Continued)

OTHER PUBLICATIONS

Hill, Ian R., et al, Non-intrusive measurement of the state-of charge of lead-acid batteries using wire-wound coils, Journal of Power Sources 103 (2001), vol. 103 No. 1, p. 98-112.

*Primary Examiner* — Arun Williams
(74) *Attorney, Agent, or Firm* — Blank Rome LLP

(57) ABSTRACT

The invention relates to an object's state or properties being monitored, such as a lithium-iron-phosphate (LFP) or other type of electrical battery containing one or more LFP or other type of electrical battery cell within the battery, and one or more sensors for measuring the state or property of the object, such as the state of charge of the battery cells, by measuring the magnetic susceptibility or other properties, such as the magnetic susceptibility of electrolyte or the electrodes within the battery cells. The state of charge of the battery cells within the battery are monitored by the one or more sensors, which are coupled to electrical circuits.

20 Claims, 4 Drawing Sheets

(51) Int. Cl.
*H01M 10/48* (2006.01)
*H01M 10/42* (2006.01)
*H01M 4/58* (2010.01)
*H01M 10/052* (2010.01)

(52) U.S. Cl.
CPC .......... *H01M10/486* (2013.01); *H01M 4/5825* (2013.01); *H01M 10/052* (2013.01); *Y02T 10/7011* (2013.01)

(56) References Cited

U.S. PATENT DOCUMENTS

| | | | |
|---|---|---|---|
| 5,537,042 A | 7/1996 | Beutler et al. | |
| 6,285,185 B1 | 9/2001 | Asjes | |
| 6,301,976 B1 * | 10/2001 | Bogdanov | 73/862.333 |
| 2003/0099884 A1 | 5/2003 | Chiang et al. | |
| 2005/0218001 A1 | 10/2005 | You et al. | |
| 2006/0051659 A1 | 3/2006 | Kelly et al. | |
| 2007/0236183 A1 * | 10/2007 | Darilek | 320/132 |
| 2008/0103707 A1 * | 5/2008 | Iwasaki et al. | 702/58 |
| 2009/0115420 A1 | 5/2009 | Koch et al. | |
| 2009/0140742 A1 * | 6/2009 | Koch et al. | 324/426 |
| 2010/0079145 A1 | 4/2010 | Meisner et al. | |

FOREIGN PATENT DOCUMENTS

| | | |
|---|---|---|
| JP | S62105377 A | 5/1987 |
| JP | H02121279 A | 5/1990 |
| JP | H04500431 A | 1/1992 |
| JP | H06215802 A | 8/1994 |
| JP | H09180722 A | 7/1997 |
| JP | 10228889 A | 8/1998 |
| JP | 2004525481 A | 8/2004 |
| JP | 2005525674 A | 8/2005 |
| JP | 2007529628 A | 10/2007 |
| JP | 2007529629 A | 10/2007 |
| JP | 2011522262 A | 7/2011 |
| WO | 2009146547 A1 | 12/2009 |

* cited by examiner

A-A

APPARATUS AND METHOD FOR MONITORING THE STATE OF CHARGE OF A BATTERY CELL

CROSS-REFERENCE TO RELATED APPLICATIONS

The present application is a National Phase of and claims the benefit of PCT/US2010/023181, with an International Filing Date of Feb. 4, 2010, which in turn claims priority to U.S. Provisional Patent Application No. 61/150,091, filed Feb. 5, 2009, the entire disclosures of which are incorporated by reference herein.

BACKGROUND OF THE INVENTION

1. Field of the Invention

The present invention is directed to devices and methods for determining, monitoring, and providing an indication of the state of charge of an object, such as a battery, using detectable magnetic flux, the object being useful in a variety of application, including a battery useful in automotive passenger vehicles.

2. Description of the Related Art

A battery consists of one or more cells connected in a series and/or parallel arrangement that chemically store electrical charge potential (energy) and deliver the charge at a predetermined voltage when demanded by an external electric circuit load. Each of the battery cells contain two half-cells connected in series by an electrolyte. An electrolyte consists of anions (i.e., negatively-charged ions) and cations (i.e., positively-charged ions). One of the half-cells contains some of the electrolyte and an anode (i.e., negative) electrode toward which anions migrate. The other half-cell contains some of the electrolyte and a cathode (i.e., positive) electrode. The electrodes do not touch each other but are electrically connected by the electrolyte, which can be either a solid or a liquid.

During battery operation, a redox (reduction—oxidation) reaction powers the battery. That is, the cations in the electrolyte are reduced (i.e., by the addition of electrons) at the cathode, and the anions are oxidized (i.e., by the removal of electrons) at the anode. As a battery cell discharges, ions flow from the anode, through the electrolyte, to the cathode. During charging, the ions then flow from the cathode, through the electrolyte, to the anode.

A theoretically perfect battery is capable of storing a charge that is a function of its design parameters and materials, delivering the charge to an external electrical load, and then being fully recharged to its original capacity. Thus, if one were to measure the charge, or amp hours, going into the cells during the charge cycle, and subtract from that accumulated charge the total charge going out of the cell during the discharge cycle, the resulting value would be an accurate indicator of the charge state, or how much energy is stored within the cell.

However, because the charge is stored chemically, each charge-discharge cycle (as well as normal temperature cycling, vibration, shock etc.) results in irreversible changes within the individual cells. Moreover, the rate of charge and/or discharge can also manifest in changes to the cell capacity. The common result of these changes is that less energy is stored during each subsequent charge cycle. For example, as the number of charge discharge cycles increases, the capacity of the cell decreases, such that at full voltage the cell may only be at 60% capacity rather than the 95% capacity when placed into service initially. Thus, the aforementioned method of subtracting the amount of charge used from the amount initially placed in the cell to determine the charge state is flawed because the actual charge capacity of the cell is reduced over time and actual usage at an unknown rate.

While knowing the actual and changing charge state of battery cells is needed, this knowledge has been primarily related to convenience in the use of portable electronic devices such computers and the like. The risk of uncertainty of the actual state of battery charge is almost always that an inconvenience will result if the battery charge falls below useful levels.

More recently, batteries have been used in conjunction with internal combustion engines to power vehicles. These so-called hybrid vehicles are capable of operating on battery power until such time that the battery is incapable of providing the mechanical energy demanded by the operator, at which point the internal combustion engine, through an electrical generator, either supplants or augments the available battery charge.

There is increased interest in the use of vehicles that operate solely by battery power, eliminating the internal combustion engine and generator altogether. This trend is facilitated in part by advances in chemical battery technology. However, regardless of the technology in which a batter is used, it is still necessary to actively determine, monitor, and provide the battery state of charge information. In purely electric vehicles, this need rises beyond convenience because there is no motive backup as is the case with hybrid vehicle configurations.

Attempts to compensate for the problems with prior techniques to determine charge utilize algorithms that take into account a variety of factors including the amount of charge/discharge cycles, the rate of charge/discharge, and other factors in an effort to weigh the integrated sum of the charge going into the cell so that the measured result corresponds to the percentage of actual cell capacity available versus the percentage of theoretical cell capacity.

Other known methods include measuring voltage and/or current at one or more locations within the discharge path. This method is prone to numerous errors. As with the technique of measuring "charge in vs. charge out", this method relies on the assumptions that either the properties of the cell remain constant (which is not true in practice), or that the changes over time and usage reliably follow an algorithm correction factor (which is generally the case, but only within a statistical band, and with potential "outliers"). Because a battery is comprised of numerous cells connected in a series and/or parallel configuration, an individual cell that is behaving as a statistical outlier with reference to the other cells can significantly degrade the function of the battery as a whole.

In U.S. Pat. No. 5,537,042, a single coil located in proximity of a cell electrode is excited with an alternating electric current. The cell charge state determines the complex impedance of the coil and its near environment. There are a number of limitations to this approach. For example, the measurement circuit output is not solely reflective of the complex impedance of the coil/electrode circuit itself, but of the entire circuit, including all of the electrical interconnects and wire runs between the coil and measuring circuit. Any resistive or reactive influence to the circuit will add error to the measurement. Moreover, the '042 patent teaches embodiments in which the complex impedance measurement of interest relates to the "plates" of the battery cells. Accordingly, the disclosed embodiments of such a device will employ relatively large coils in order to maximize their interaction with the cell plates. In addition to the obvious packaging, weight, and manufacturing issues with such an arrangement, larger coils require substantially more power for excitation at the requisite levels, leading to less efficiency and increased likelihood of propagating electromagnetic fields that may interact with other measurement coils or nearby electronics.

Other methods of evaluating the state of charge within a battery cell require that a sensor be immersed within the cell, or that a sample of the cell electrolyte be removed, in order to measure properties such as density (specific gravity) or optical characteristics.

Accordingly, what is needed is an apparatus and method for determining, monitoring, and providing an indication of the state of charge of a battery that overcomes the limitations of the prior art.

SUMMARY OF THE INVENTION

It is a principal object of the present invention to provide a device for determining, monitoring, and providing an indication of the state of electrical charge of an object.

It is another object of the present invention to provide a device and method for determining, monitoring, and providing an indication of the magnetization, magnetic moment, and magnetic permeability of an object.

It is still object of the present invention to provide a component of an automotive device, consumer electronic device, or other type of device having an electrical battery, and in particular to provide an electrical battery, one or more electrical battery cells within the battery, and one or more sensors for measuring the state of charge of the battery cells. These components are assembled to measure the magnetic susceptibility of the electrolyte or the electrodes within the battery cells.

It is another object of the present invention to provide a method for monitoring the state of charge of the battery and battery cells using sensors, thereby determining the state of charge at any given time or over a given or pre-determined time period.

It is still another object of the present invention to provide an indication of the state of charge of the battery and battery cells through the use of an audible, visual, or other device.

In order to obtain useful information about the battery cell state of charge, it is another object of the present invention to use one or more excitation coils that are used to create and direct a magnetic field through the battery cell enclosure and electrolyte and/or electrodes, and one or more fluxgate magnetometers to measure the degree to which the magnetic field is attenuated as a result of the magnetic susceptibility of the electrolyte and/or electrodes.

It still another object of the present invention to provide a sensor for monitoring the state of charge of a battery cell, the sensor having a coil mounting substrate, a printed circuit board, at least one wire leading to a sensing circuit, a drive coil, a first of at least two sense coils, wherein each of the at least two sense coils preferably have an amorphous core, and a drive coil core having an integral flux guide.

It is another object of the present invention to provide a sensor that can be easily mounted to the battery cell without adding substantial weight or requiring substantial change to the size of the battery cell, and that can be manufactured and assembled without significant additional effort.

It is still another object of the present invention to provide a sensor housing attached to the mounting device for housing the sensor components to protect them from the surrounding environment.

It is another object of the present invention to provide a sensing circuit that receives a signal over the at least one wire, and wherein the signal provides information about a magnetic susceptibility of the battery cell.

It is still another object of the present invention to provide a sensor for use with a battery cell of a battery, where the battery cell is an LFP battery cell, and the battery is used in an automotive passenger vehicle.

It is another object of the present invention to provide a device and method for determining, monitoring, and providing an indication of, with regard to an object, it temperature, proximity to other objects, stress (magneto-strictive effect), resistance (magneto-resistive effect), volume, mass (certain materials), material identification (certain materials), magnetic classification (diamagnetism, ferromagnetism, paramagnetism, etc.), defect detection, chemical detection (gaseous leak detection, contamination (heavy-metal content in food, blood, water/environment, etc., pharmaceutical quality), biological processes (biosensors, magnetic-resonance imaging (MRI) contrasting-agent detection/concentration in the bloodstream), and iron content), chemical oxidation, ionization, and any physical quantity that has a relationship with the magnetic properties listed above. That is, fundamental physical properties, fundamental chemical properties, fundamental biological properties of the object.

Those and other objects and advantages of the present invention are accomplished, as fully described herein, by an apparatus for monitoring the state of charge of an object comprising a state of charge sensor adapted to being attached proximate to an object, the sensor comprising an inductive drive coil for outputting a magnetic field; and at least one flux coil for sensing a change in the magnetic field by measuring a change in the inductance of the at least one flux coil, the change being indicative of a state of electrical charge potential of the object.

The objects and advantages of the present invention are also accomplished, as fully described herein, by an apparatus for monitoring the state of charge of a battery cell comprising: a battery state of charge sensor adapted to being attached proximate to a battery cell, the sensor comprising: an inductive drive coil for outputting a magnetic field; and at least one flux coil for sensing a change in the magnetic field by measuring a change in the inductance of the at least one flux coil, the change being indicative of a state of electrical charge potential of the battery cell. The apparatus may further comprise a battery cell, the battery cell comprising a battery cell electrode and an electrolyte in contact with the battery cell electrode.

DESCRIPTION OF THE SEVERAL DRAWINGS

DETAILED DESCRIPTION OF THE INVENTION

Figure 1:
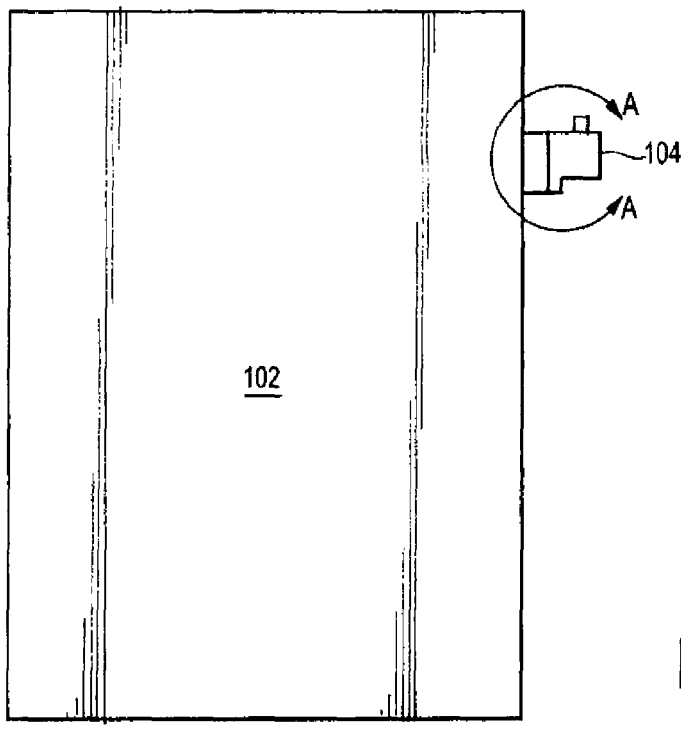
FIG. 1 is an elevation view drawing of a battery cell having a battery state of charge sensor according to the present invention attached thereto.

Several preferred embodiments of the invention are described for illustrative purposes, it being understood that the invention may be embodied in other forms not specifically shown in the drawing. The figures will be described with respect to the system architecture and methods for using the system to achieve one or more of the objects of the invention and/or receive the benefits derived from the advantages of the invention as set forth above.

The present invention is directed to a sensor for measuring the magnetic susceptibility of an object by generating a magnetic field that permeates the object and by sensing the resultant changes in that same magnetic field. The "object" may be a volume with constant or variable magnetic susceptibility, as may be related to some other physical quantity or condition. Examples of the physical condition include but are not limited to the material temperature, the concentration of ions in the material, or the structure of the material.

In general, the system and method as more fully described below in terms of its application to a battery cell, involve positioning an electromagnet or permanent magnet with attached flux-director volume adjacent to the object to be measured, and positioning a set of magneto-inductive magnetic field sensors adjacent to the object so that the magnetic flux lines from the electromagnet permeate the magnetic field sensors as well as the object. The path of the magnetic flux lines extends through both the object and the magnetic field sensors. These components include an electromagnet preferably made from a high-permeability ferromagnetic core, an attached high-permeability flux-director volume, and one or more magneto-inductive magnetic field sensors. The amount of magnetization of the object depends upon both the applied magnetic field and the magnetic properties of the object. The magnetization of the object then creates its own magnetic field components external to the object, that modify the magnetic field around the object. The magnetic field sensors measure the change of magnetic field outside the object caused by a change of the magnetic properties of the object (i.e., the object's magnetic susceptibility) or the magnetization of the object.

One embodiment of the invention is use of an electromagnet driven by an AC current to produce an AC magnetic field, or a DC current may be used. Other unconventional sources of AC magnetic fields may be used as well, to include, but not limited to, spinning magnets. It is also contemplated that the field sensors could work without the magnetized component being present at all, but rather relying on some other existing magnetic field source in the vicinity of the object being measured. It is also possible that the invention could work by utilizing only the intrinsic magnetic field of the object itself. It is further contemplated that the invention could work without the presence of a flux-director volume (described below). It is also possible that the magnet and magnetic field sensors could be combined into one single part. The magnetic field sensors do not have to be "magneto-inductive." They could operate by a variety of methods.

In the figures, a system and method for a specific embodiment, i.e., measuring the state of charge (SOC) within a battery and in particular a battery cell, are shown and suggested to illustrate one application of the present invention. The SOC is directly or indirectly measured by measuring the magnetic susceptibility of the electrolyte and electrodes, and uses excitation coils, magnetic flux directing structures, one or more fluxgate magnetometer coils, and associated electronic circuitry.

Figure 2:
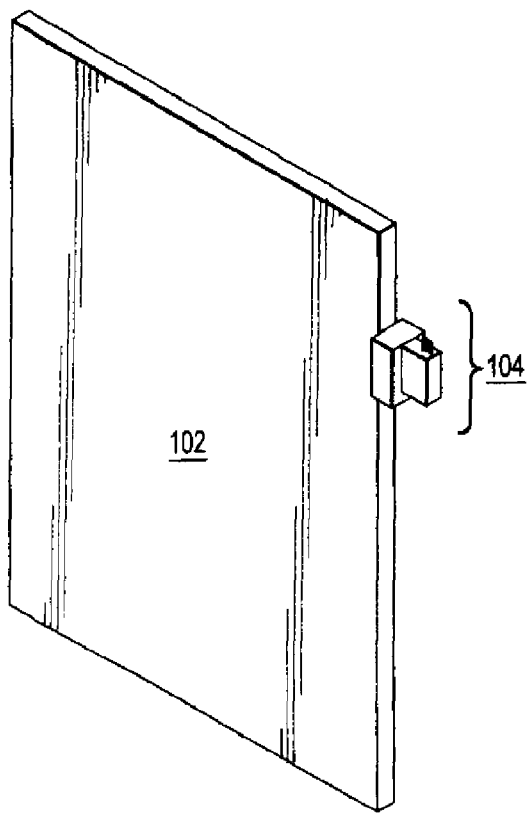
FIG. 2 is a perspective view drawing of the battery cell and battery state of charge sensor shown in FIG. 1.
Figure 3:
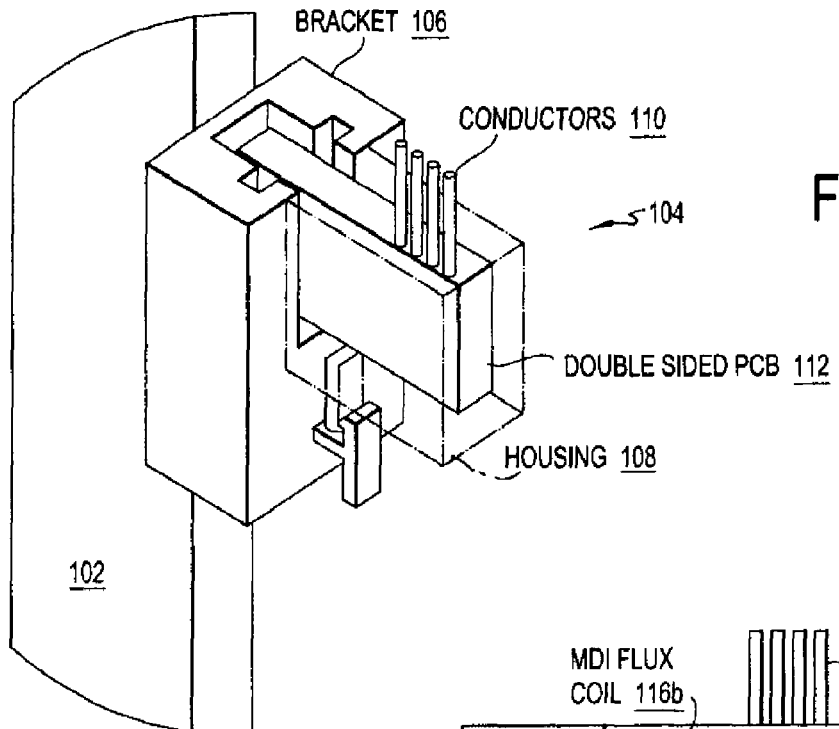
FIG. 3 is a closer view of the battery state of charge sensor shown in FIG. 2.

The preferred arrangement of the components of the present invention involves placing an excitation coil in close proximity to a battery cell as shown in FIGS. 1-3, with the excitation coil excited by an alternating electrical current.

Turning first to FIG. 1, shown therein is an elevation view drawing of a single battery cell 102 having a battery state of charge sensor 104 according to the present invention attached thereto. The battery cell 102 is shown, for illustrative purposes, as having a rectangular shape, with dimensions 165× 226 mm, although other shapes and sizes are also contemplated. The battery cell 102 may be made of any known battery cell materials suitable for the applications described herein. For example, the battery cell 102 may be a lithium-iron-phosphate ($LiFePO_4$, or LFP) battery cell. The battery state of charge sensor 104 may be positioned proximate to or directly attached to any suitable portion of the battery cell 102, though specific positions will be readily apparent to the skilled artisan taking into account the configuration, size, and shape of the battery cell 102, other battery cells, the assembly of battery cells and electrolyte, battery housing, and other factors. The arrangement of the battery cell 102 and the battery state of charge sensor 104 are further illustrated in the perspective view drawing of FIG. 2.

Turning now to FIG. 3, shown therein is a closer view of section A-A of FIG. 1 but in a perspective view. The perspective view shows the battery state of charge sensor 104 shown attached to the battery cell 102. In the embodiment illustrated, the battery cell 102 has a width of 5.4 mm. The battery state of charge sensor 104 is attached to the battery cell 102 using a bracket 106, which has a width of 12.7 mm. The bracket 106 supports a battery state of charge sensor housing 108, which has a width of 6.9 mm. The battery state of charge sensor housing 108 is shown as having a rectangular shape and forming an interior space, though other shapes may also be used. The battery state of charge sensor housing 108 extends outward and approximately perpendicular to the end of the battery cell 102 to which the bracket 106 is attached. The battery state of charge sensor housing 108 may be made such that it is detachable from the bracket 106, and the bracket 106 is may be made such that it is detachable from the battery cell 102.

Extending outward through the battery state of charge sensor housing 108 are a plurality of electrical conductors 110. The electrical conductors 110 are connected to one or more printed circuit boards 112 within the battery state of charge sensor housing 108. The printed circuit boards 112 are potted within the battery state of charge sensor housing 108 using a suitable potting material that provides strain relief for the electrical conductors 110.

Figure 4:
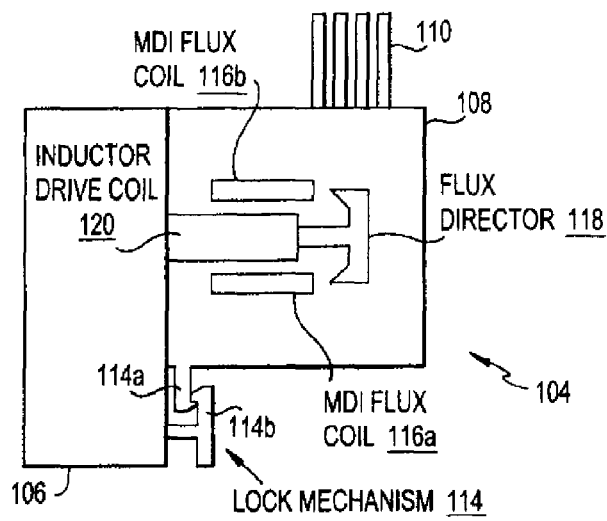
FIG. 4 is an elevation view drawing of the battery state of charge sensor shown in FIG. 3.

Turning now to FIG. 4, shown therein is an elevation cross-section view drawing of the battery state of charge sensor 104 of FIG. 3 showing, in this embodiment, the bracket 106 having dimensions 8.4×21.6 mm, the battery state of charge sensor housing 108 having a dimension of 15.240 mm in one dimension and 23.4 mm together with the bracket 106, and the electrical conductors 110. As noted above, the battery state of charge sensor housing 108 is detachable from the bracket 106, but in an operating configuration, a lock mechanism 114 holds the two components together. The lock mechanism 114 shown includes two oppositely-facing and engaging flanges 114a, 114b, however, any suitable mechanical locking device could be used to securely engage the battery state of charge sensor housing 108 to the bracket 106.

Inside the battery state of charge sensor housing 108 is at least one flux coil 116, a flux director 118, and an inductive drive coil 120. In the embodiment shown, two flux coils 116a, 116b are used, which may be flux coils manufactured by Magna-Lastic Devices, Inc., Chicago, Ill. Each of the flux coils 116a, 116h preferably has an amorphous core. The flux director 118 is either connected to an electromagnet core, or a small air gap is placed between the electromagnet core and the flux director 118. The flux director 118 is also placed in proximity to the battery cell 106, depending upon the shape of the battery cell 106.

All of the components inside the housing 108 must be oriented in a configuration so that the magnetic field from the electromagnet or applied field source completes a loop that encompasses the object being monitored and the magnetic field sensors in its path. The magnetic field sensors and the magnetic field source must be placed as close together as possible, without causing magnetic saturation of the magnetic field sensors.

The changing current in the inductive drive coil 120 (i.e., excitation coil) creates a corresponding magnetic field having a flux path that lies external to the inductive drive coil 120. This magnetic field propagates through the outside structure of the battery (not shown), the battery cell 102, the electrolyte compound (not shown) and/or electrode (not shown) within the battery cell 102. The magnetic flux originating from the inductive drive coil 120 travels through the electrolyte and/or electrodes within the battery cell 102 and is then linked with the one or more flux coils 116a, 116b.

Figure 5:
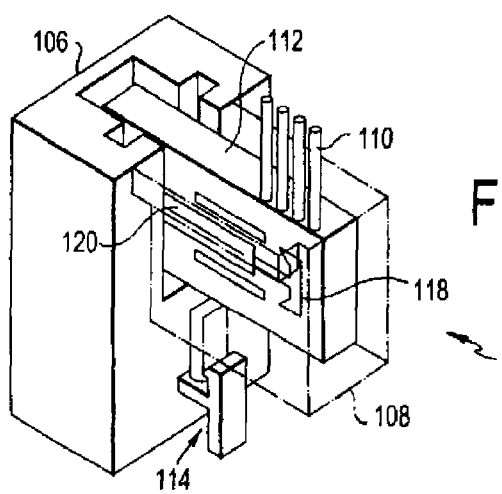
FIG. 5 is another perspective view drawing of an embodiment of the battery state of charge sensor according to the present invention.

Turning now to FIG. 5, shown therein is another perspective view drawing of an embodiment of the battery state of charge sensor according to the present invention. As shown, the battery state of charge sensor 104 of the present invention includes the bracket 106 attached to the battery cell 102, the battery state of charge sensor 104, the printed circuit boards 112, the electrical conductors 110 leading to a sensing circuit (discussed below), the inductive drive coil 120, the flux coils 116a, 116b, the flux director 118 having an integral flux guide, and, where needed, a temperature sensor (not shown).

The magnetic field sensed by the flux coils 116a, 116b is determined by either measuring the voltage or current induced in the flux coils 116a, 116b, or directly measuring the magnetic field with a sensitive measuring device such as a flux gate coil-based sensor. Based on the amplitude or phase of the coupled signal or the magnitude of the magnetic field in relation to the drive signal from the inductive drive coil 120, the magnetic susceptibility of the material through which the magnetic field passes can be determined.

Magnetic susceptibility can be defined as the magnetization of a material per unit applied magnetic field. It is generally known in the art that the magnetic susceptibility of both a battery cell electrolyte and its electrodes is, in part, a function of the amount of energy stored within the cell.

More specifically, magnetic susceptibility can be defined as:

$$\mu=(1+\chi)\mu 0,$$

where:
$\mu$=permeability;
$\mu 0$=permeability of free space and
$\chi$=susceptibility.

An alternative form of the above expression often used expresses magnetic susceptibility in terms of relative permeability defined as $\mu/\mu 0$ yielding the following expression:

$$\mu/\mu 0=1+\chi$$

A variety of factors, such as temperature, can cause a variation in the magnetic susceptibility of an electrolyte and battery electrodes. Accordingly, a suitable temperature sensor (described below) may be used. The electronic output of the temperature sensor provides a correction factor that can be used to correct the raw state of charge output signal.

As shown above, four quantities are related physically, and can affect the magnetization of an object. The magnetization of the object creates a magnetic field outside the object that is measured by the invention. The "applied magnetic field" created by the drive source may be removed. The magnetic field at the sensor will be a superposition of the fields from the drive source and the magnetized object. One configuration would include an additional "field sensor" located such that the superposition of the applied magnetic field and the magnetic field from the object if different from the first sensor. The measurements could then be combined to reduce the "applied field" measurement.

Paramagnetic materials, like lithium, have a relative permeability greater than 1 ($\chi>1$), while ferromagnetic material have a relative permeability much greater than 1 ($\chi>>1$). In a lithium-iron-phosphate ($LiFePO_4$, or LIT) battery cell, lithium ions transport the charge from the electrode into the electrolyte and back. As the lithium concentration in the electrolyte changes with the state of charge, the concentration of paramagnetic material in each electrode will also change. The changing concentration of the paramagnetic material will alter the magnetic properties of the both the electrolyte and the electrodes. One of the properties that will be altered is the magnetic susceptibility. Thus, when a material with variable susceptibility and therefore variable permeability like lithium is located close to a drive coil like the inductive drive coil 120 and a pickup coil(s) like the flux coils 116a, 116b so that there is flux linkage between the drive coil, material, and pickup coil(s), the flux linkage will vary as the susceptibility varies. The flux linkage between the coils will change with the susceptibility.

A preferred fluxgate coil of the present invention for use as flux coils 116a, 116b is a coil wound on a core which is made from an amorphous metal wire or strip. The fluxgate coil is energized with an alternating current and has an inductance that is a function of (a) the geometry of the coil winding and (b) the permeability of the core material. In the presence of a magnetic field of increasing strength, the permeability will remain at a relatively high and constant value until a threshold of magnetic field strength is reached, at which point the permeability of the core instantaneously reduces to a value of approximately 1 (manifested by a very square B-H loop). The magnetic field acting on the amorphous core is the sum of (a) the magnetic field generated by the alternating current through the fluxgate coil and (b) the ambient magnetic field. As the current through the fluxgate coil increases during each half cycle, the inductance of the fluxgate coil will remain constant until a certain point, at which time the sum of the ambient magnetic field and the magnetic field generated by the coil triggers a reduction in the permeability of the amorphous core to approximately the permeability value of air. This sudden change in permeability then causes a corresponding change in the inductance of the fluxgate coil.

In the case of the present invention, the ambient magnetic field of interest is that which is linked from the inductive drive coil 120 through the electrolyte and/or electrodes within the battery cell 102. In other words, because magnetic susceptibility of the electrolyte and electrodes vary in accordance with the stored energy within the battery cell 102, the flux linkage between the inductive drive coil 120 and flux coils 116a, 116b is directly related to the charge state of the battery cell 102.

In addition to the inductive drive coil 120 and flux coils 116a, 116b, the preferred embodiment of the present invention also incorporates one or more flux directing structures like the flux director 118. The structures are typically made from materials exhibiting very high permeability, examples of which include alloy materials high in nickel or cobalt. A flux director serves two separate functions. The first is to improve efficiency of the system. The flux directors, having extremely high permeability, tend to "gather" all of the magnetic flux proximate to their location, with the flux exiting the structure in a much denser and focused form. As a result the flux is more efficiently utilized, thus requiring the less flux (hence less electrical power) to perform a given function than if no flux director is used.

The second purpose of the flux director is to improve signal to noise ratio. As noted previously, the bi-stable permeability characteristic of the amorphous core of the flux coils 116a, 116b is affected by ambient magnetic fields. The geometry of the amorphous core, in this instance preferably long and thin, gives the core of the flux coils 116a, 116b a preferred axis of sensitivity to those ambient fields. Using one or more flux directors like flux director 118 tends to focus the magnetic flux of interest (i.e., that which is coupled through the electrolyte and or electrodes of the battery cell 102) and "ignore" extraneous random noise fields that may intersect the amorphous core of the flux coils 116a, 116b.

In one embodiment of the present invention, a battery state of charge sensor 104 (including at least one excitation inductive drive coil 120, at least one flux director 118, and at least one flux coil 116a or 116b) is associated with every battery cell within a battery. In another embodiment, a battery state of charge sensor 104 is used for only one battery cell 102 within a battery, while in other embodiments a battery state of charge sensor 104 is used in fewer than all of the battery cells within the battery.

The battery state of charge sensor 104 could be a separate component that is attached to an individual battery cell 102 or to the enclosure of a battery containing multiple battery cells. It could also be insert molded into the enclosure of a battery cell or a battery.

Figure 6:
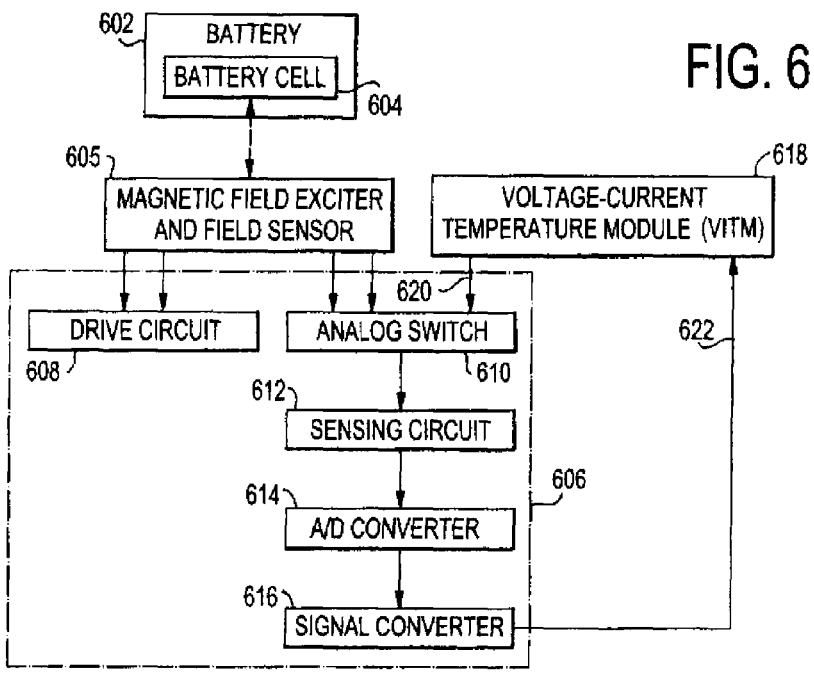
FIG. 6 is a block diagram of the circuit system according to one embodiment of the present invention.

Turning now to FIG. 6, shown therein is a block diagram of some of the components and electrical circuits according to one embodiment of the present invention, in which an individual battery cell 604 within a battery 602 are shown proximate to the magnetic sensor elements and field exciters 605. More specifically, a battery 602 is shown, which may be a battery for use in an automotive passenger vehicle (not shown), but other applications are contemplated. The battery 602 may include a plurality of battery cells arranged in a linear manner inside a housing (not shown) of the battery 602. Attached to or proximate to the battery cell 604 is a corresponding magnetic field exciter and sensor 605, which is electrically connected by four electrical conductors to a mixed signal conditioning and processing integrated circuit 606, which includes a number of circuit components as shown in FIG. 6.

In particular. FIG. 6 illustrates each of a first pair of two electrical conductors from the magnetic sensor elements and field exciters 605 is connected to a drive circuit 608. Each of a second pair of two electrical conductions from the magnetic sensor elements and field exciters 605 is connected to an analog switch circuit 610, or they may be connected directly to a sensing circuit 612. The analog switch circuit 610 is electrically connected to a sensing circuit 612. The output from the sensing circuit 612 is processed by an analog-to-digital converter 614 and a signal converter 616. A voltage-current temperature module circuit 618 may be used to receive the output from the signal converter 616, and it may output a clock signal 620. The output (slave) interface signal 622 is a signal that is indicative of the battery or battery cell state of charge. One of ordinary skill in the art will appreciate that there are circuit configurations other than the one shown in FIG. 6 for producing the exciting and sensing aspects of the present invention as previously described.

Figure 7:
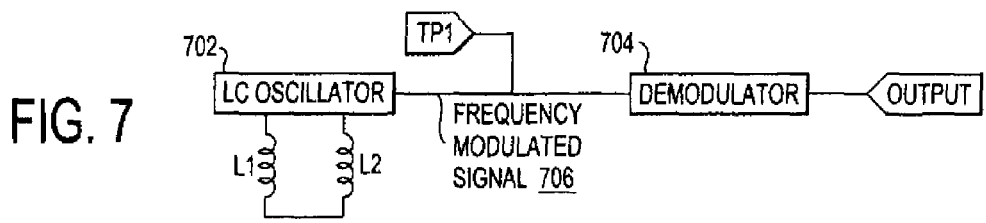
FIG. 7 is block diagram of the sensing circuit shown in FIG. 6 according to one embodiment of the present invention.
Figure 8:
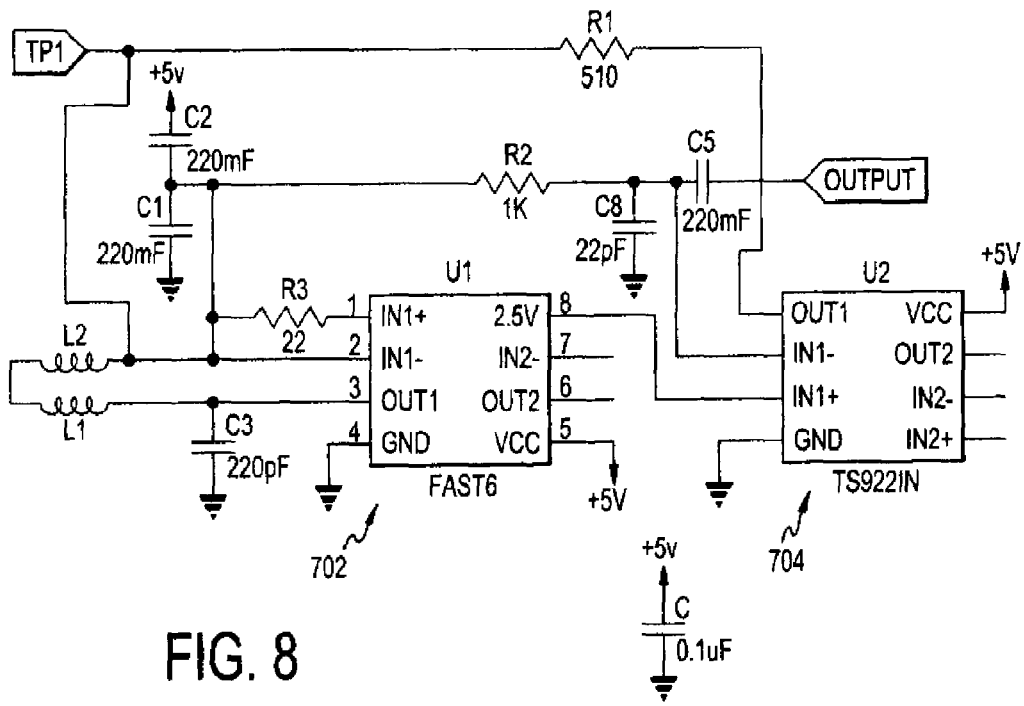
FIG. 8 is a schematic drawing of the sensing circuit shown in FIG. 7.

The sensing circuit 612 is further illustrated in FIG. 7, which depicts a block diagram showing an LC oscillator circuit 702 connected to two inductors L1 and L2 for generating signals at a particular frequency as described further below. The LC oscillator circuit 702 outputs a frequency modulated signal 706 (indicate by TP1), which is input to a demodulator circuit 704, described further below. The output of the demodulator circuit 704 is input into the analog-to-digital converter 614. FIG. 8 is a schematic drawing of the actual sensing circuit 612 according to one embodiment of the present invention. Shown therein is the LC oscillator circuit 702 comprising connections 1-8 on printed circuit board component U1, with inductors L1 and L2, and demodulator circuit 704.

Figure 9:
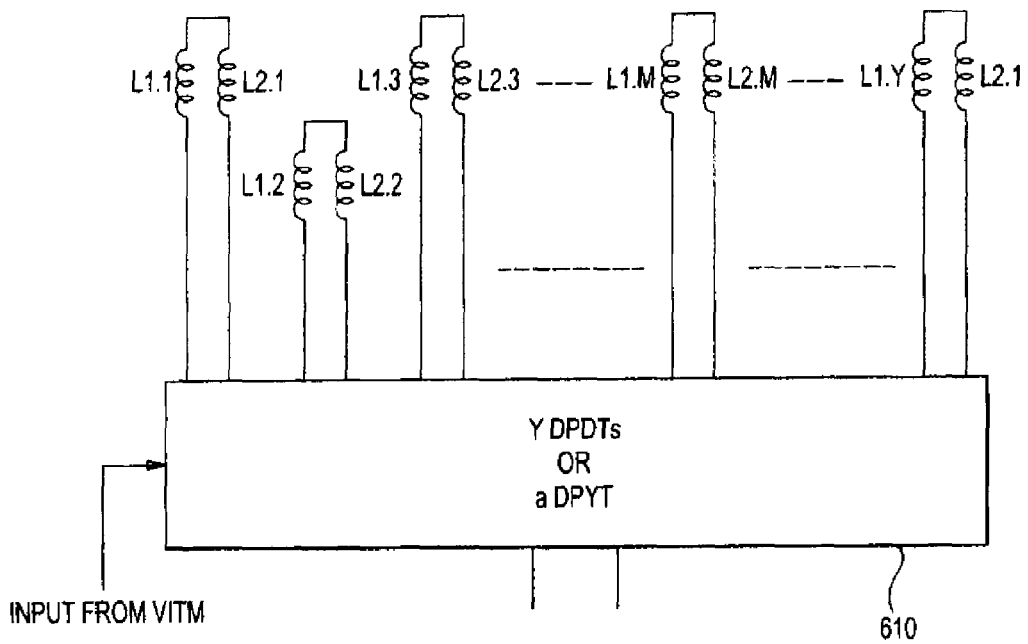
FIG. 9 is block diagram and schematic of the analog switch circuit shown in FIG. 6 according to one embodiment of the present invention.

The analog switch circuit 610 is further illustrated in FIG. 9, which is a partial block and circuit diagram and schematic showing the output from the VITM circuit 618 as input to the analog switch circuit 610, and the electrical connections to inductor pairs L1-1, L2-1 of the magnetic sensor element associated with the battery cell 1, inductor pairs L-1-2, L2-2 of the magnetic sensor element associated with the battery cell 2, etc.

Figure 10:
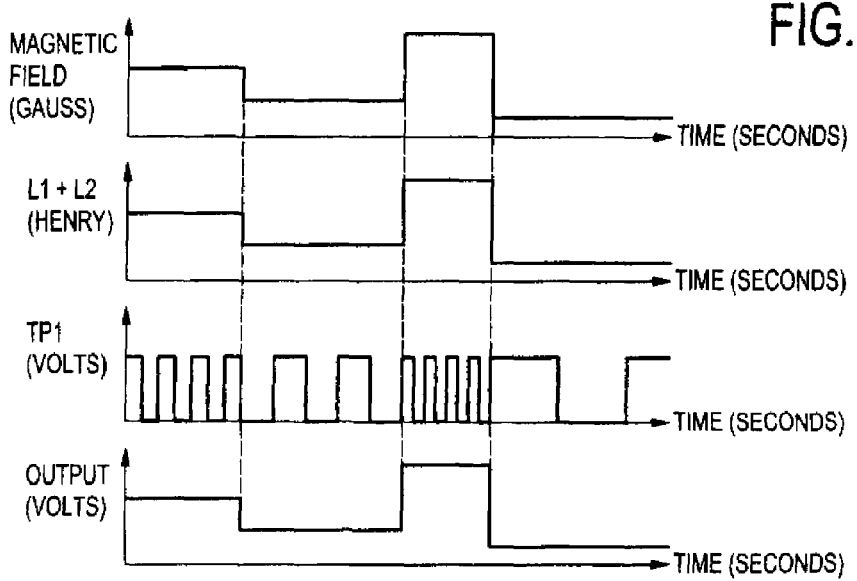
FIG. 10 is a diagram containing several time series graphs of signals from the sensing circuit.

Turning now to FIG. 10, shown therein are time series graphs of signals from the sensing circuit 612. The graphs may be understood with reference to the following. First, the inductor pairs L1, L2 of the magnetic sensor elements and field exciters are configured within the LC oscillator circuit 702. The oscillating frequency fc is proportional to the inductance of the sensing inductors as follows:

$$fc = \alpha 1 \times (L1 \pm L2)$$

Here, $\alpha 1$ is a constant. Under changing surrounding magnetic field, the inductance of L1 and L2 will change, inducing a change in the oscillating frequency fc according to:

$$\Delta L \rightarrow \Delta f$$

TP1 is then a frequency-modulated signal. A demodulator will convert this signal into a DC voltage output proportional to the frequency of TP1.

$$OUTPUT = \alpha 2 \times fc$$

Here, $\alpha 2$ is a constant. It is assumed here that $\Delta L = \alpha 3 \times \Delta H$, where $\alpha 3$ is a constant. That is, the change of inductance of the sensing inductors has linear relationship with the change in surrounding magnetic field. The circuit as described above can be built and tested using a 6 mm fluxgate as an inductive drive coil 120, although other fluxgates may be used.

With regard to the drive circuit 608 as shown in FIG. 6, the drive signal is, in one embodiment, a sinusoidal signal with a 2.5 VDC mean and 2V amplitude. The drive signal should be able to drive up to 0.1 A.

It should be apparent that the signal processing electronics as illustrated in FIGS. 6-10 and described above and further below could be an integral part of the state of charge sensor or could be located remotely. Moreover, a quantity of state of charge sensors could be connected to a single set of signal processing electronics via a multiplexed array. An example of the latter would be multiple state of charge sensors corresponding to the amount of cells within a battery, all being multiplexed into one set of signal processing electronics. Another embodiment would be to also incorporate post processing of the multiplexed state of charge sensor outputs to report the general state of charge of the battery as a whole, as well as diagnostic/warning alert functions if one or more cells within a battery are not operating within a band of averages for the other cells within that battery.

Another embodiment of the invention utilizes the above identified diagnostic information to automatically reconfigure the connection of individual cells within a battery, or individual batteries within a battery pack, to provide a "limp home" function in the event that catastrophic cell or battery failures occur.

Another embodiment of the present invention uses different magnetic field sources such as permanent magnets. In that embodiment, an additional fluxgate coil could be used to sense the magnetic field. A variation of this embodiment would involve using a fluxgate coil that is directly associated with the magnet connected in a reverse series configuration with the fluxgate coils used to measure the flux exiting the cell. This would have the effect of subtracting the level of flux coming out of the cell from the amount of flux entering the cell. This method has the advantage of automatically compensating for any variation on the amount of flux entering the cell due to, for example, thermal coefficient of magnet strength.

Yet another embodiment of the present invention uses magnetic sensor means besides the aforementioned fluxgate coils, such as magnetostrictive sensors, giant magnetostrictive sensors, Hall effect cells, etc.

Although the battery cell 102 shown in the figures illustrate flat battery cells, batteries may instead use cylindrical battery cells grouped into sub-groups called modules, with groups of modules used to make a battery pack. The battery state of charge sensor 104 described above and illustrated in the drawings is equally useful in detecting the state of charge of cylindrical battery cells and battery packs.

In use, the present battery state of charge sensor 104 may further include a circuit for outputting an audible and/or visual signal to an observer, or it may store useful information indicating a status of the state of charge of the battery cell 102 (such as an electronic record stored in programmable read-only memory, read-only memory, random access memory accessible by a suitable device).

Other useful applications of the present invention contemplated include those in the following fields of endeavor and industry: battery cell manufacturers (quality control, etc.), battery management systems groups, automobile companies (hybrid-electric vehicles, electric vehicles, etc.), battery users, portable battery-operated electronic device manufacturers, chemists, physicists, biologists, material scientists, pharmaceutical quality control, environmental scientists, soils scientists, Federal Department of Agriculture, manufacturers of a variety of products (defect detection, quality control), medical device manufacturers, Magnetic Resonance Imaging (MRI) manufacturers, and state-of-the art lock manufacturers (safes).

One of ordinary skill in the art will appreciate that the term "electromagnet" part could be also be called an "applied field source" or a "magnetic field source" or even a "magnet." The term "magneto-inductive magnetic field sensors" are often referred to as "magnetic field sensors." The term "flux director" is often called a "flux-guide" or "pole piece."

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by any appended claims and the applicable rules of law.

We claim:

1. An apparatus for monitoring the state of charge of a battery cell comprising:
    a battery state of charge sensor adapted to being attached proximate to a battery cell, the sensor comprising:
        an inductive drive coil for outputting a magnetic field; and
        at least one flux coil for sensing a change in the magnetic field by measuring a change in the inductance of the at least one flux coil, the change being indicative of a state of charge of the battery cell.

2. The apparatus according to claim 1, further comprising a battery cell, the battery cell comprising a battery cell electrode and an electrolyte in contact with the battery cell electrode.

3. The apparatus according to claim 2, wherein the battery cell is part of a battery.

4. The apparatus according to claim 2, wherein the battery cell is an LFP battery cell.

5. The apparatus according to claim 2, wherein the battery cell is adapted for use in a automotive motor vehicle battery.

6. The apparatus according to claim 1, further comprising a bracket for attaching the sensor to the battery cell.

7. The apparatus according to claim 6, further comprising a housing detachably connected to the bracket, the housing containing at least the inductive drive coil and the at least one flux coil.

8. The apparatus according to claim 1, further comprising a sensing circuit for receiving a signal indicative of the magnetic susceptibility of the battery cell.

9. The apparatus according to claim 1, wherein the at least one flux coil comprises an amorphous core.

10. The apparatus according to claim 9, wherein the amorphous core is made from an amorphous metal wire or strip.

11. The apparatus according to claim 1, wherein the at least one flux coil is one of a magnetostrictive sensor, giant magneotstrictive sensor, and Hall effect cell sensor.

12. An LFP battery for an automotive motor vehicle comprising:
    a plurality of interconnected battery cells, wherein at least one of the plurality of battery cells includes a battery status of charge sensor attached to the at least one battery cell;
    a circuit electrically connected to the battery status of charge sensor for receiving a signal indicative of the state of charge of the at least one battery cell; and
    a memory device for electrically storing the signal,
    wherein the battery status of charge sensor comprises:
        an inductive drive coil for outputting a magnetic field; and
        at least one flux coil for sensing a change in the magnetic field by measuring a change in the inductance of the at least one flux coil, the change being indicative of a state of charge of the battery cell.

13. The battery according to claim 12, wherein the at least one flux coil comprises an amorphous core.

14. The battery according to claim 13, wherein the amorphous core is made from an amorphous metal wire or strip.

15. The battery according to claim 12, further comprising a device for outputting audible, visual, or audible and visual information about the signal or a change in the signal.

16. The battery according to claim 12, further comprising a circuit for optimizing the connection of individual battery cells within the battery based on the state of charge of each of the battery cells.

17. A method for monitoring the state of charge of a battery cell comprising the steps of:
   providing a battery state of charge sensor adapted to being attached proximate to a battery cell, the sensor comprising:
      an inductive drive coil for outputting a magnetic field; and
      at least one flux coil for sensing a change in the magnetic field by measuring a change in the inductance of the at least one flux coil;
   outputting a magnetic field from the inductive drive coil;
   sensing a change in the magnetic field; and
   outputting a signal indicative of a state of charge of the battery cell.

18. The method according to claim 17, further comprising the step of providing at least one battery cell adapted to storing an electrical charge, the battery cell comprising a battery cell electrode and an electrolyte in contact with the battery cell electrode.

19. The method according to claim 18, further comprising the step of providing a battery for use in an automotive motor vehicle, the battery comprising a plurality of battery cells each having a battery state of charge sensor.

20. An apparatus for monitoring the state of charge of an object comprising:
   a state of charge sensor adapted to being attached proximate to the object, the sensor comprising:
      an inductive drive coil for outputting a magnetic field; and
      at least one flux coil for sensing a change in the magnetic field by measuring a change in the inductance of the at least one flux coil, the change being indicative of a state of charge of the object.

* * * * *